(12) United States Patent
Morikawa

(10) Patent No.: US 10,121,949 B2
(45) Date of Patent: Nov. 6, 2018

(54) LIGHT EMITTING DEVICE

(71) Applicant: NICHIA CORPORATION, Anan-shi (JP)

(72) Inventor: Takeshi Morikawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/719,561

(22) Filed: Sep. 29, 2017

(65) Prior Publication Data

US 2018/0097163 A1    Apr. 5, 2018

(30) Foreign Application Priority Data

Sep. 30, 2016 (JP) .................. 2016-194897

(51) Int. Cl.
*H01L 33/62* (2010.01)
*H01L 33/64* (2010.01)
*H01L 33/48* (2010.01)

(52) U.S. Cl.
CPC ............ *H01L 33/62* (2013.01); *H01L 33/486* (2013.01); *H01L 33/647* (2013.01)

(58) Field of Classification Search
CPC ....................................... H01L 33/62
See application file for complete search history.

(56) References Cited

U.S. PATENT DOCUMENTS

| | | | |
|---|---|---|---|
| 7,481,558 B2 * | 1/2009 | Lin ................. | H01L 33/486 362/241 |
| 2006/0108669 A1 | 5/2006 | Matsumoto et al. | |
| 2008/0048201 A1 | 2/2008 | Kim et al. | |
| 2009/0315068 A1 * | 12/2009 | Oshio ................. | H01L 33/62 257/103 |
| 2010/0001308 A1 * | 1/2010 | Park .................. | H01L 33/62 257/99 |
| 2011/0031525 A1 * | 2/2011 | Nemoto ............. | B29C 45/0025 257/99 |
| 2011/0198658 A1 * | 8/2011 | An .................. | H01L 33/647 257/99 |
| 2012/0080711 A1 | 4/2012 | Kokubu et al. | |

(Continued)

FOREIGN PATENT DOCUMENTS

| | | |
|---|---|---|
| JP | 09-298263 | 11/1997 |
| JP | 2004-146815 | 5/2004 |

(Continued)

*Primary Examiner* — Eugene Lee
(74) *Attorney, Agent, or Firm* — Mori & Ward, LLP

(57) ABSTRACT

A light emitting device includes a resin molded body, which includes a front surface having an opening, a bottom surface opposite to the opening a front-rear direction of the light emitting device, and first and second wall portions extending from the bottom surface to the front surface. A first lead includes a first bottom portion provided on the bottom surface, first and second side portions provided in the first and second wall portions, respectively. A second lead include a second bottom portion provided on the bottom surface apart from the first lead to provide a first resin region, third and fourth side portions provided in the first and second wall portions apart from the first lead to provide second and third resin regions, respectively. The first resin region is provided between the second resin region and the third resin region viewed in the front-rear direction.

8 Claims, 4 Drawing Sheets

(56) References Cited

U.S. PATENT DOCUMENTS

2014/0110745 A1\* 4/2014 Lee .................. H01L 33/62
                                                257/99
2017/0229627 A1\* 8/2017 Nakabayashi .......... H01L 33/62

FOREIGN PATENT DOCUMENTS

| JP | 2008-053726 | 3/2008 |
| JP | 2010-021259 | 1/2010 |
| JP | 2012-079723 | 4/2012 |

\* cited by examiner

LIGHT EMITTING DEVICE

CROSS-REFERENCE TO RELATED APPLICATIONS

The present application claims priority under 35 U. S. C. § 119 to Japanese Patent Application No. 2016-194897, filed Sep. 30, 2016. The contents of this application are incorporated herein by reference in their entirety.

BACKGROUND OF THE INVENTION

Field of the Invention

The present disclosure relates to a light emitting device.

Discussion of the Background

Recently, a light emitting element with a high brightness and a high output and a compact light emitting device have been developed and used in various fields. For example, reduction in thickness of a light source used in a backlight device for a liquid crystal display device is required to reduce size and weight of a device for which the light source is used. In view of this, for a light emitting device used as a light source, for example, various light emitting devices having a structure referred to as a side-view type have been developed. In the side-view type light emitting device, generally, a light emitting element is mounted in a package having a recess that has an opening in a front surface of the package, and two lead electrodes are drawn out from the inside of the package and serve as external terminals (for example, Japanese Unexamined Patent Application Publication No. 09-298263).

SUMMARY OF THE INVENTION

According to one aspect of the present invention, a light emitting device includes a package and a light emitting element. The package includes a resin molded body, a first lead, and a second lead. The resin molded body is made of a resin and includes a front surface, a bottom surface, a first wall portion, and a second wall portion. The front surface has an opening. The bottom surface is opposite to the opening in a front-rear direction of the light emitting device. The first wall portion extends from the bottom surface to the front surface. The second wall portion extends from the bottom surface to the front surface to be opposite to the first wall portion to provide the opening. The first lead includes a first bottom portion, a first side portion, and a second side portion. The first bottom portion is provided on the bottom surface of the resin molded body. The first side portion is provided in the first wall portion to extend from the first bottom portion toward the front surface. The first side portion includes a first projecting portion. The second side portion is provided in the second wall portion to extend from the first bottom portion toward the front surface. The second lead include a second bottom portion, a third side portion, and a fourth side portion. The second bottom portion is provided on the bottom surface apart from the first lead to provide a first resin region between the first bottom portion and the second bottom portion. The first resin region is made of the resin. The third side portion is provided in the first wall portion apart from the first lead to extend from the second bottom portion toward the front surface. The first projecting portion projects toward the third side portion to provide a second resin region made of the resin between the first projecting portion and the third side portion. The fourth side portion is provided in the second wall portion apart from the first lead to extend from the second bottom portion toward the front surface. The fourth side portion includes a second projecting portion projecting toward the second side portion to provide a third resin region made of the resin between the second projecting portion and the second side portion. The first resin region is provided between the second resin region and the third resin region viewed in the front-rear direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
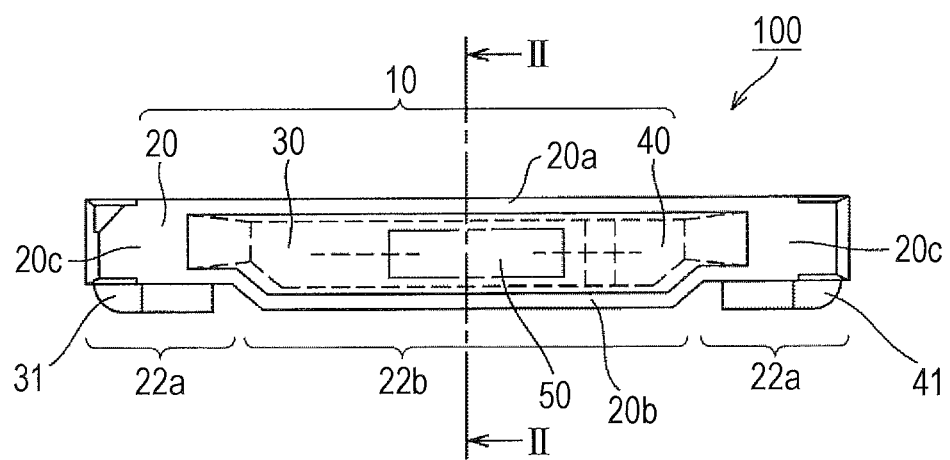
FIG. 1 is a schematic front view of a light emitting device according to one embodiment of the present invention.

Certain embodiments will now be described with reference to the accompanying drawings, wherein like reference numerals designate corresponding or identical elements throughout the various drawings.

The embodiment described below is intended as illustrative to give a concrete form to a technical idea of the present invention, and the technical scope of the present invention shall not be limited to the embodiment below unless otherwise specifically described. In addition, the size, the positional relationship, and the like of members illustrated in the drawings may be exaggerated for clear description.

First Embodiment

Figure 2:
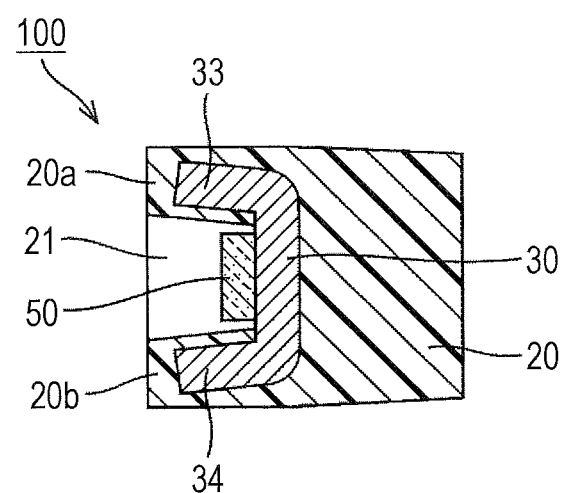
FIG. 2 is a schematic cross-sectional view taken along line II-II in FIG. 1.
Figure 3:
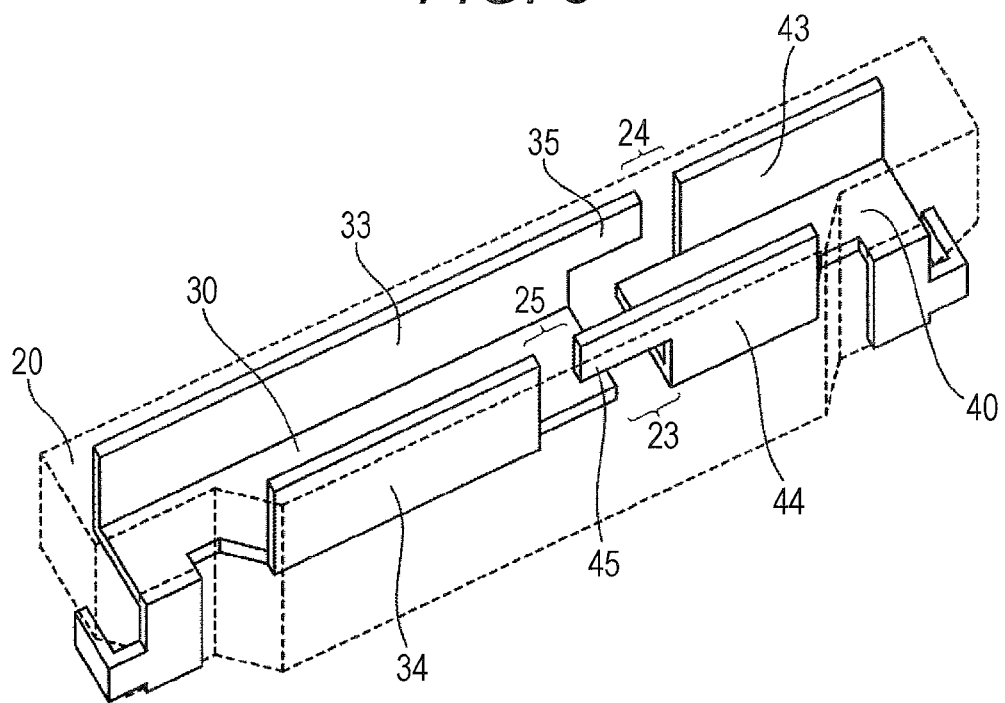
FIG. 3 is a schematic perspective view illustrating one example of a lead.
Figure 4:
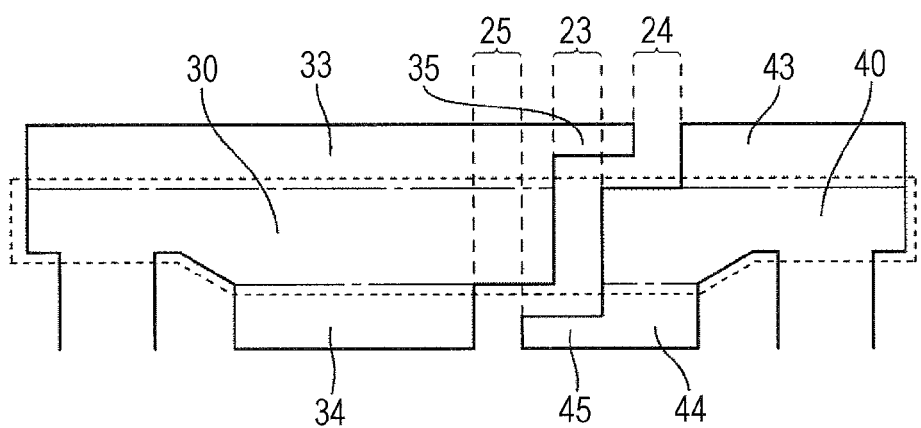
FIG. 4 is a schematic plan view illustrating one example of a bent portion of a lead frame.

FIG. 1 is a schematic front view (i.e., schematic front surface view) of a light emitting device 100 according to a first embodiment. FIG. 2 is a schematic sectional view taken along line II-II in FIG. 1. FIG. 3 is a schematic perspective view illustrating one example of leads. FIG. 4 is a schematic plan view illustrating one example of a lead frame.

The light emitting device 100 includes a package 10 having a resin molded body 20 and a first lead 30 and a second lead 40, which are positive and negative leads. In the resin molded body 20, a surface including a light emitting surface is referred to as a "front surface" and the surface opposite to the front surface is referred to as a "back surface". A surface on which the first lead 30 and the second lead 40 are drawn out is referred to as a "lower surface" and a surface opposite to the lower surface is referred to as an "upper surface". A lower surface side of the resin molded body 20 is referred to as a mounting surface of the light emitting device 100. The resin molded body 20 includes an opening 21 in the front surface. The opening 21 of the resin molded body 20 has a shape elongated in a lateral direction in a front view. At a bottom surface (which includes at a first bottom portion and a second bottom portion) in the opening 21, the first lead 30 and the second lead 40 that are aligned in a longitudinal direction of the resin molded body 20 are exposed and spaced apart from each other. A light emitting element 50 is mounted in the opening 21. In the present embodiment, description is given in which a lead on a left side in FIG. 1 is referred to as the first lead 30 and a lead on a right side in FIG. 1 is referred to as the second lead 40, but the definition may be the other way around.

The opening 21 is surrounded by an upper wall portion 20a (a first wall portion) and a lower wall portion 20b (a second wall portion) disposed opposite to each other in a thickness direction of the light emitting device 100 and two side wall portions 20c disposed opposite to each other in a width direction of the light emitting device 100. The upper wall portion 20a and the lower wall portion 20b has a thickness smaller than a thickness of the side wall portions 20c. The upper wall portion 20a constitutes the upper surface of the resin molded body 20 and the lower wall portion 20b constitutes the lower surface of the resin molded body 20.

The first lead 30 includes a first outer lead portion 31 extending out from the lower surface of the resin molded body 20, and bent and further extending along the lower surface of the resin molded body 20. The second lead 40 includes a second outer lead portion 41 extending out from the lower surface of the resin molded body 20 and bent and further extending along the lower surface of the resin molded body 20.

The first lead 30 includes, in the upper wall portion 20a of the resin molded body 20, a first upper-side bent portion 33 (a first side portion 33) formed by bending the first lead 30 at an upper edge side thereof in a short-length direction toward the front surface, and, in the lower wall portion 20b of the resin molded body 20, a first lower-side bent portion 34 (a second side portion 34) formed by bending the first lead at a lower edge side thereof in the short-length direction toward the front surface. Further, the second lead 40 includes, in the upper wall portion 20a of the resin molded body 20, a second upper-side bent portion 43 (a third side portion 43) formed by bending the second lead at the upper edge side thereof in the short-length direction toward the front surface, and, in the lower wall portion 20b of the resin molded body 20, a second lower-side bent portion 44 (a fourth side portion 44) formed by bending the second lead at the lower edge side thereof in the short-length direction toward the front surface. In the description below, the first upper-side bent portion 33, the first lower-side bent portion 34, the second upper-side bent portion 43, and the second lower-side bent portion 44 may be referred to as "bent portions" collectively. As shown in FIG. 3, the first upper-side bent portion 33 faces the first lower-side bent portion 34, and the second upper-side bent portion 43 faces the second lower-side bent portion 44. Further, the first lead 30 includes a first extending portion 35 (a first projecting portion 35) that extends from a front surface-side portion of the first upper-side bent portion 33 toward the second upper-side bent portion 43, and the second lead 40 includes a second extending portion 45 (a second projecting portion 45) that extends from a front surface-side portion of the second lower-side bent portion 44 toward the first lower-side bent portion 34.

The resin molded body 20 includes, on the bottom surface in the opening, a first region 23 (a first resin region 23) located between the first lead 30 and the second lead 40. The upper wall portion 20a of the resin molded body 20 includes a second region 24 (a second resin region 24) located between the first extending portion 35 of the first lead 30 and the second upper-side bent portion of the second lead 40. The lower wall portion 20b of the resin molded body 20 includes a third region 25 (a third resin region 25) located between the second extending portion 45 of the second lead 40 and the first lower-side bent portion of the first lead 30. In a top view of the resin molded body 20, the first region 23 is disposed between the second region 24 and the third region 25.

In the light emitting device 100 having the configuration described above, the first region 23, the second region 24, and the third region 25 that are spaced-apart regions relatively low in mechanical strength between the first lead 30 and the second lead 40 are disposed spaced from each other so as not to overlap each other in the top view of the resin molded body 20. That is, in the top view of the resin molded body 20, the first lead 30 or the second lead 40 can be disposed in either the upper wall portion 20a or the lower wall portion 20b to secure the strength of the package 10. In addition, the second region 24 in the upper wall portion 20a and the third region 25 in the lower wall portion 20b are disposed opposite to each other with the first region 23 interposed between the second region 24 and the third region 25. Accordingly, the second region 24 and the third region 25, which have relatively small mechanical strength, are disposed to prevent the arrangement in which both the second region 24 and the third region 25 are located at either one side of the resin molded body 20. With this configuration, even if the thickness of the upper wall portion 20a and the lower wall portion 20b of the package 10 is decreased, the strength of the package 10 can be secured, so that the light emitting device 100 with good strength of the package while reduction in thickness can be realized.

As shown in FIG. 3, the second region 24 faces the second lower-side bent portion 44, and the third region 25 faces the first upper-side bent portion 33. With this configuration, in the top view of the resin molded body 20, the leads can be respectively disposed to face the second region 24 and the third region 25, which have relatively low mechanical strength, so that the strength of the package can be improved.

The lower surface of the resin molded body 20 includes lead-disposed portions 22a on which the first outer lead portion 31 and the second outer lead portion 41 are disposed, and a protruding portion 22b that is located below the lead-disposed portions 22a. In the top view of the resin molded body 20, the first lower-side bent portion 34 and the second lower-side bent portion 44 are disposed in a region where the protrusion portion 22b is disposed. On the other hand, the first upper-side bent portion 33 and the second upper-side bent portion 43 are disposed over a region where the lead-disposed portions 22a and the protrusion portion 22b are disposed. On the bottom surface in the opening portion 21 of the resin molded body 20, the first lead 30 has a length greater than the second lead 40 in a direction perpendicular to a vertical direction of the resin molded body 20 (which is referred to as a "lateral direction" in the below). In this case, the second lower-side bent portion 44 has a width in the lateral direction which is smaller than the width of the other bent portions, so that it is preferable that the second extending portion 45 is disposed at the second lower-side bent portion 44.

Each member is described below in detail.

Package 10

The package 10 is a container that houses the light emitting element 50 and includes terminals (i.e., electrodes) for supplying power to the light emitting element 50 from external component. The package 10 includes the resin molded body 20, the first lead 30, and the second lead 40. The package 10 according to the present embodiment is for a side surface-emitting light emitting device.

Resin Molded Body 20

The resin molded body 20 is a base body of the container in the package 10. The resin molded body 20 constitutes a part of the outer shape of the package 10. The resin molded body 20 preferably has a light reflectance of 70% or more, more preferably 80% or more, further preferably 90% or more with respect to a light emission peak wavelength of the light emitting element 50, in view light extraction efficiency of light extracted toward a front side of the package. Further, the resin molded body 20 is preferably white. The resin molded body 20 undergoes a fluid state, i.e., a liquid state (including a sol state or a slurry state) before curing or solidifying. The resin molded body 20 can be molded by, for example, injection molding or transfer molding.

For a base material of the resin molded body 20, a thermosetting resin or a thermoplastic resin can be used. Examples of such resins include resins as described below and modified resins (including hybrid resins) thereof. For the base material of the resin molded body 20, a thermoplastic resin is preferable in view of facilitating molding via an injection molding method and reducing cost compared to thermosetting resin. For a thermoplastic resin, any one of an aliphatic polyamide resin, polycyclohexane terephthalate, and polycyclohexylenedimethylene terephthalate is preferable. On the other hand, a thermosetting resin is preferable in view of improving heat resistance and light resistance and increasing operation life, and higher reliability than those of the thermoplastic resin. For a thermosetting resin, any one of an epoxy resin, a silicone resin, and an unsaturated polyester resin is preferable. In particular, an unsaturated polyester resin or a modified resin thereof can be molded by injection molding while having good heat resistance and light resistance, which is a characteristic of the thermosetting resin, and thus is preferable. In view of, for example, light reflective properties, mechanical strength, and heat elasticity, the base material of the resin molded body 20 preferably contains a white pigment and a filler as described below, but may have any appropriate composition.

Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. For the white pigment, one of these substances can be used alone or two or more of these substances can be used in combination. Among these, titanium oxide has a relatively high refractive index and good light shielding properties, and thus is preferable.

First Lead 30, Second Lead 40

The first lead 30 and second lead 40 constitute positive and negative terminals (electrodes), respectively, in the package 10. In the light emitting device 100 according to the present embodiment, one package 10 includes at least a pair of leads, and may include three or more leads. In the present embodiment, the first outer lead portion 31 of the first lead 30 and the second outer lead portion 41 of the second lead 40 extend out from the lower surface of the resin molded body 20, which allows for reducing a length of a heat releasing path from the light emitting element 50 to a mounting substrate.

Each of the first lead 30 and the second lead 40 includes a base body obtained by performing various processing steps such as pressing (including punching), etching, and rolling on a flat plate of copper, aluminum, gold, silver, tungsten, iron, nickel, cobalt, molybdenum, or alloys of these metals. Each of the first lead 30 and the second lead 40 may be made of a layered body of these metals and/or alloys of two or more of these metals, but is preferably made of a single layer, which can be formed easily. In particular, a copper alloy (e.g., phosphor bronze or a copper-iron alloy) containing copper as a main component is preferable. In addition, on surfaces of the leads, a light reflecting film of, for example, silver, aluminum, rhodium, or alloys of two or more of these metals may be disposed, and in particular, the light reflecting film is preferably made of silver or a silver alloy, which has good light reflectance.

A thickness of the first lead 30 and the second lead 40 can be appropriately selected and is, for example, 0.05 mm or more and 1 mm or less, preferably 0.07 mm or more and 0.3 mm or less, more preferably 0.1 mm or more and 0.2 mm or less. The first lead 30 and the second lead 40 may be, for example, a small piece of a lead frame.

Variant Example of Bent Portions

Figure 5:
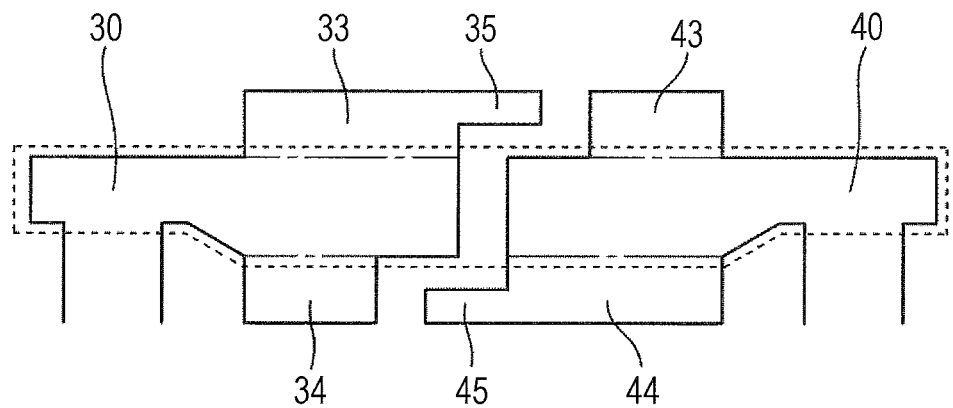
FIG. 5 is a schematic plan view illustrating a varied example of the bent portion.

FIG. 5 is a schematic plan view illustrating a variant example of the lead frame. The first upper-side bent portion 33 and the second upper-side bent portion 43 are disposed only above a region where the protruding portion 22b is to be disposed. Such a configuration also allows for enhancing the strength of the upper wall portion 20a and the lower wall portion 20b.

Figure 6:
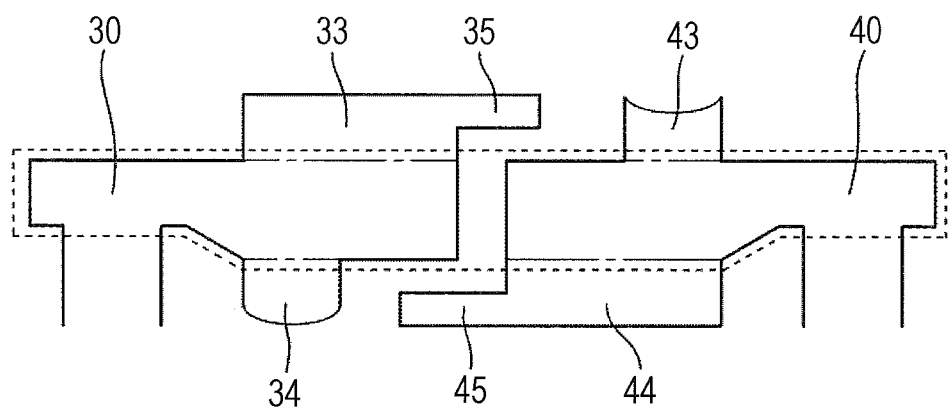
FIG. 6 is a schematic plan view illustrating a varied example of the bent portion.
Figure 7:
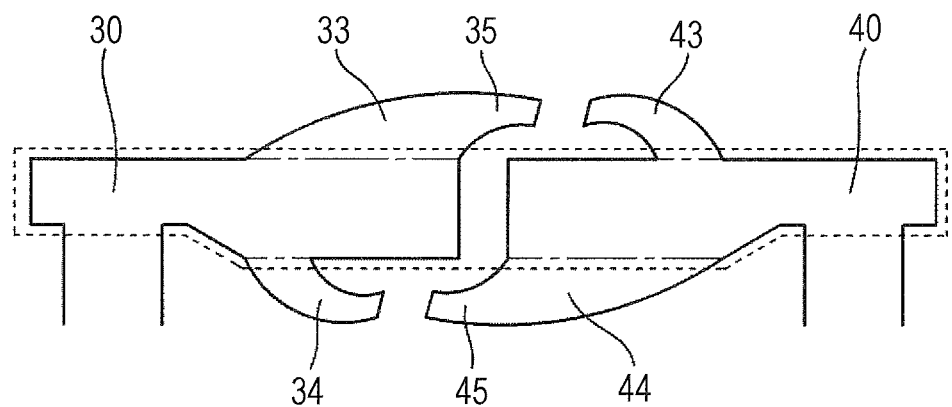
FIG. 7 is a schematic plan view illustrating a varied example of the bent portion.

FIG. 6 is a schematic plan view illustrating another variant example of the lead frame. In the variant example, a front surface-side edge portion of the first lower-side bent portion 34 and a front surface-side edge portion of the second upper-side bent portion 43 has an arc shape. FIG. 7 is a schematic plan view illustrating still another variant example of the lead frame. In this variant example, an edge portion of each of the first upper-side bent portion 33, the first lower-side bent portion 34, the second upper-side bent portion 43, and the second lower-side bent portion 44 has an arc shape. In such a manner, with the edge portions of the bent portions having an arc shape, concentration of stress can be reduced, so that the strength of the package 10 can be secured. Examples of a shape of each of these bent portions include various shapes such as a polygonal shape, a semicircular shape, a semielliptical shape, and a fan shape.

Figure 8:
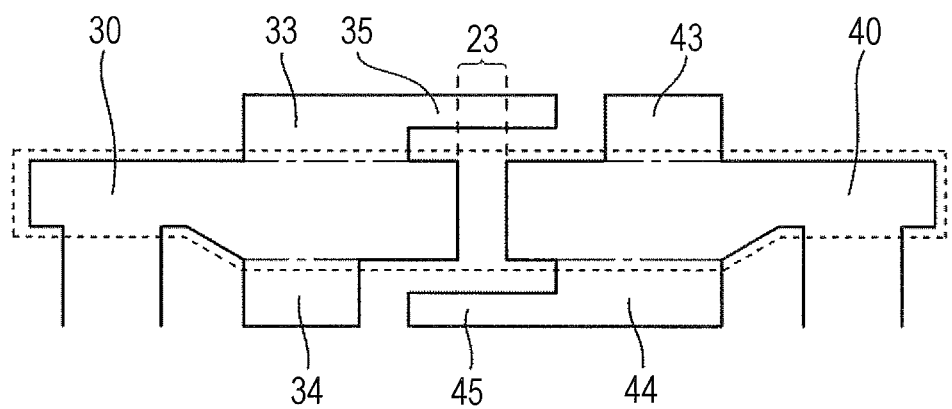
FIG. 8 is a schematic plan view illustrating a varied example of the bent portion.

FIG. 8 is a schematic plan view illustrating even another variant example of the lead frame. In this variant example, a front surface-side edge portion of the first upper-side bent portion 33 opposite to the second upper-side bent portion 43 is disposed beyond the first region 23. Similarly, a front surface-side edge portion of the second lower-side bent portion 44 opposite to the first lower-side bent portion 34 is disposed beyond the first region. Such a configuration also allows for enhancing the strength of the upper wall portion 20a and the lower wall portion 20b.

Light Emitting Element 50

The light emitting element 50 includes electrodes on the same surface side. This light emitting element 50 is mounted on an upper surface of the first lead 30. For the light emitting element 50, a known semiconductor light emitting element can be applied that is made of, for example, a nitride semiconductor. A light emitting element having any wavelength can be selected to obtain a desired light emission color.

The light emitting element 50 is housed in the package 10 and mounted on the first lead 30 and/or the second lead 40 that are exposed at the bottom surface in the opening 21 of the resin molded body 20. One light emitting element 50 or a plurality of light emitting elements 50 can be mounted on the first lead 30, or one or more light emitting elements can be mounted on each of the first lead 30 and the second lead 40. Alternatively, in the case where one or more light emitting elements are flip-chip mounted, the one or more light emitting elements are mounted across the first lead 30 and the second lead 40. In this case, the length of the first lead 30 can be almost equal to the length of the second lead 40.

For the light emitting element 50, light emitting diodes having various light emission wavelengths can be used. In particular, in order to obtain white light emission, it is preferable to combine a nitride semiconductor light emitting element that adapted to emit blue light and a phosphor that absorbs blue light and adapted to emit yellow light, green light, or red light.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a package comprising:
        a resin molded body made of a resin and comprising:
            a front surface having an opening;
            a bottom surface opposite to the opening in a front-rear direction of the light emitting device;
            a first wall portion extending from the bottom surface to the front surface; and
            a second wall portion extending from the bottom surface to the front surface to be opposite to the first wall portion to provide the opening;
        a first lead comprising:
            a first bottom portion provided on the bottom surface of the resin molded body;
            a first side portion provided in the first wall portion to extend from the first bottom portion toward the front surface, the first side portion comprising:
                a first projecting portion; and
            a second side portion provided in the second wall portion to extend from the first bottom portion toward the front surface; and
        a second lead comprising:
            a second bottom portion provided on the bottom surface apart from the first lead to provide a first resin region between the first bottom portion and the second bottom portion, the first resin region being made of the resin;
            a third side portion provided in the first wall portion apart from the first lead to extend from the second bottom portion toward the front surface, the first projecting portion projecting toward the third side portion to provide a second resin region made of the resin between the first projecting portion and the third side portion; and
            a fourth side portion provided in the second wall portion apart from the first lead to extend from the second bottom portion toward the front surface, the fourth side portion comprising:
                a second projecting portion projecting toward the second side portion to provide a third resin region made of the resin between the second projecting portion and the second side portion, the first resin region being provided between the second resin region and the third resin region viewed in the front-rear direction; and
        a light emitting element mounted in the opening.

2. The light emitting device according to claim 1, wherein the second resin region is opposite to the fourth side portion, and the third resin region is opposite to the first side portion.

3. The light emitting device according to claim 1, wherein the first bottom portion of the first lead is wider than the second bottom portion of the second lead.

4. The light emitting device according to claim 2, wherein the first bottom portion of the first lead is wider than the second bottom portion of the second lead.

5. The light emitting device according to claim 1,
    wherein the first side portion is opposite to the second side portion, and
    wherein the third side portion is opposite to the fourth side portion.

6. The light emitting device according to claim 2,
    wherein the first side portion is opposite to the second side portion, and
    wherein the third side portion is opposite to the fourth side portion.

7. The light emitting device according to claim 3,
    wherein the first side portion is opposite to the second side portion, and
    wherein the third side portion is opposite to the fourth side portion.

8. The light emitting device according to claim 4,
    wherein the first side portion is opposite to the second side portion, and
    wherein the third side portion is opposite to the fourth side portion.

* * * * *